United States Patent

North et al.

(10) Patent No.: US 9,655,259 B2
(45) Date of Patent: May 16, 2017

(54) DATA PROCESSING EQUIPMENT STRUCTURE

(71) Applicant: CHATSWORTH PRODUCTS, INC., Westlake Village, CA (US)

(72) Inventors: Travis North, Pflugerville, TX (US); Steven Bornfield, Albuquerque, NM (US); Samuel Rodriguez, Leander, TX (US)

(73) Assignee: Chatsworth Products, Inc., Agoura Hills, CA (US)

( * ) Notice: Subject to any disclaimer, the term of this patent is extended or adjusted under 35 U.S.C. 154(b) by 938 days.

(21) Appl. No.: 13/707,521

(22) Filed: Dec. 6, 2012

(65) Prior Publication Data

US 2013/0149954 A1    Jun. 13, 2013

Related U.S. Application Data

(60) Provisional application No. 61/568,692, filed on Dec. 9, 2011.

(51) Int. Cl.
*H05K 5/02* (2006.01)
*H05K 7/20* (2006.01)

(52) U.S. Cl.
CPC ....... *H05K 5/0213* (2013.01); *H05K 7/20745* (2013.01)

(58) Field of Classification Search
None
See application file for complete search history.

(56) References Cited

U.S. PATENT DOCUMENTS

| 2,766,861 A | 10/1956 | Abramson |
| 3,192,306 A | 6/1965 | Skonnord |
| 3,364,838 A | 1/1968 | Bradley |
| 4,467,584 A | 8/1984 | Crites et al. |
| 4,495,545 A | 1/1985 | Dufresne et al. |
| 4,541,219 A | 9/1985 | Parker |

(Continued)

FOREIGN PATENT DOCUMENTS

| AU | 2008254682 | 11/2012 |
| DE | 2509487 A1 | 9/1976 |

(Continued)

OTHER PUBLICATIONS

Emerson Network Power, "Smart Cooling Solutions Data Center," Oct. 2012, http://www.emersonnetworkpower.com/en-EMEA/Products/RACKSANDINTEGRATEDCABINETS/Documents/Knurr%20DCD/Smart-Cooling-Solutions-Data-Center-EN.pdf.*

(Continued)

*Primary Examiner* — Alissa Tompkins
*Assistant Examiner* — Martha Becton
(74) *Attorney, Agent, or Firm* — Tillman Wright, PLLC; James D. Wright; David R. Higgins

(57) ABSTRACT

A data processing equipment structure includes a plurality of sidewalls and a ceiling panel, which, together, define an enclosed space. The structure further includes at least one equipment enclosure and at least one cooling unit arranged in side-to-side relationship in a row within the enclosed space. At least one separation panel divides the enclosed space into a front plenum at a front side of the row and a rear plenum at a rear side of the row. Cool air in the front plenum is isolated from heated exhaust air in the rear plenum.

20 Claims, 14 Drawing Sheets

(56) References Cited

U.S. PATENT DOCUMENTS

| | | | |
|---|---|---|---|
| 4,592,602 A | 6/1986 | Kuster et al. |
| 4,774,631 A | 9/1988 | Okuyama et al. |
| 4,782,245 A | 11/1988 | Henry |
| 5,020,866 A | 6/1991 | McIlwraith |
| 5,147,121 A | 9/1992 | McIlwraith |
| 5,165,770 A | 11/1992 | Hahn |
| 5,216,579 A | 6/1993 | Basara et al. |
| RE34,393 E | 9/1993 | McIlwraith |
| 5,250,752 A | 10/1993 | Cutright |
| 5,294,748 A | 3/1994 | Schwenk et al. |
| 5,488,543 A | 1/1996 | Mazura et al. |
| 5,528,454 A | 6/1996 | Niklos |
| 5,544,012 A | 8/1996 | Koike |
| 5,570,740 A | 11/1996 | Flores et al. |
| 5,639,150 A | 6/1997 | Anderson et al. |
| 5,671,805 A | 9/1997 | Stahl et al. |
| 5,695,263 A | 12/1997 | Simon et al. |
| 5,791,498 A | 8/1998 | Mills |
| 5,806,945 A | 9/1998 | Anderson et al. |
| 5,806,946 A | 9/1998 | Benner et al. |
| 5,851,143 A | 12/1998 | Hamid |
| 5,938,302 A | 8/1999 | Anderson et al. |
| 5,941,767 A | 8/1999 | Fukuda |
| 5,954,301 A | 9/1999 | Joseph et al. |
| 5,995,368 A | 11/1999 | Lee et al. |
| 5,997,117 A | 12/1999 | Krietzman |
| 6,034,873 A | 3/2000 | Stahl et al. |
| 6,044,193 A | 3/2000 | Szentesi et al. |
| 6,067,233 A | 5/2000 | English et al. |
| 6,104,003 A | 8/2000 | Jones |
| D432,098 S | 10/2000 | Nelson et al. |
| 6,127,663 A | 10/2000 | Jones |
| 6,163,454 A | 12/2000 | Strickler |
| 6,181,557 B1 | 1/2001 | Gatti |
| 6,185,098 B1 | 2/2001 | Benavides |
| 6,198,628 B1 | 3/2001 | Smith |
| 6,222,729 B1 | 4/2001 | Yoshikawa |
| 6,223,479 B1 * | 5/2001 | Stockli .................. E04B 1/3442 52/126.1 |
| 6,238,029 B1 | 5/2001 | Marzec et al. |
| 6,336,691 B1 | 1/2002 | Maroney et al. |
| 6,373,721 B2 | 4/2002 | Lecinski et al. |
| 6,381,147 B1 | 4/2002 | Hayward et al. |
| 6,401,940 B1 | 6/2002 | Hartel et al. |
| 6,410,844 B1 | 6/2002 | Bruner et al. |
| 6,462,944 B1 | 10/2002 | Lin |
| 6,494,050 B2 | 12/2002 | Spinazzola et al. |
| 6,513,770 B1 | 2/2003 | Franz et al. |
| 6,554,697 B1 | 4/2003 | Koplin |
| 6,557,357 B2 | 5/2003 | Spinazzola et al. |
| 6,574,970 B2 | 6/2003 | Spinazzola et al. |
| 6,601,932 B1 | 8/2003 | Helgenberg et al. |
| 6,611,428 B1 | 8/2003 | Wong |
| 6,616,524 B2 | 9/2003 | Storck, Jr. et al. |
| 6,652,373 B2 | 11/2003 | Sharp et al. |
| 6,672,955 B2 | 1/2004 | Charron |
| 6,745,579 B2 | 6/2004 | Spinazzola et al. |
| 6,788,535 B2 | 9/2004 | Dodgen et al. |
| 6,819,563 B1 | 11/2004 | Chu et al. |
| 6,854,284 B2 | 2/2005 | Bash et al. |
| 6,859,366 B2 | 2/2005 | Fink |
| 6,867,967 B2 | 3/2005 | Mok |
| 6,980,433 B2 | 12/2005 | Fink |
| 7,011,576 B2 | 3/2006 | Sharp et al. |
| 7,033,267 B2 | 4/2006 | Rasmussen |
| 7,046,514 B2 | 5/2006 | Fink et al. |
| 7,074,123 B2 | 7/2006 | Bettridge et al. |
| 7,112,131 B2 | 9/2006 | Rasmussen et al. |
| 7,144,320 B2 | 12/2006 | Turek et al. |
| 7,145,772 B2 | 12/2006 | Fink |
| 7,154,748 B2 | 12/2006 | Yamada |
| 7,173,820 B2 | 2/2007 | Fink et al. |
| 7,182,208 B2 | 2/2007 | Tachibana |
| 7,226,353 B2 | 6/2007 | Bettridge et al. |
| 7,236,362 B2 | 6/2007 | Wang et al. |
| 7,255,640 B2 | 8/2007 | Aldag et al. |
| 7,259,963 B2 | 8/2007 | Germagian et al. |
| 7,286,345 B2 | 10/2007 | Casebolt |
| 7,293,666 B2 | 11/2007 | Mattlin et al. |
| 7,309,279 B2 | 12/2007 | Sharp et al. |
| 7,349,209 B2 | 3/2008 | Campbell et al. |
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,486,512 B2 | 2/2009 | Campbell et al. |
| 7,495,169 B2 | 2/2009 | Adducci et al. |
| 7,498,512 B2 | 3/2009 | Adducci et al. |
| 7,500,911 B2 | 3/2009 | Johnson et al. |
| 7,504,581 B2 | 3/2009 | Adducci et al. |
| 7,508,663 B2 | 3/2009 | Coglitore et al. |
| 7,529,086 B2 | 5/2009 | Fink et al. |
| 7,542,287 B2 | 6/2009 | Lewis, II et al. |
| 7,604,535 B2 | 10/2009 | Germagian et al. |
| 7,643,291 B2 | 1/2010 | Mallia et al. |
| 7,656,660 B2 | 2/2010 | Hoeft et al. |
| 7,684,193 B2 | 3/2010 | Fink et al. |
| 7,697,285 B2 | 4/2010 | Donowho et al. |
| 7,718,891 B2 | 5/2010 | Adducci et al. |
| 7,746,637 B2 | 6/2010 | Donowho et al. |
| 7,751,188 B1 | 7/2010 | French et al. |
| 7,752,858 B2 | 7/2010 | Johnson et al. |
| 7,764,495 B2 | 7/2010 | Hruby et al. |
| 7,772,489 B2 | 8/2010 | Adducci et al. |
| 7,795,532 B2 | 9/2010 | Walker |
| 7,804,685 B2 | 9/2010 | Krietzman |
| 7,839,635 B2 | 11/2010 | Donowho et al. |
| 7,878,888 B2 | 2/2011 | Rasmussen et al. |
| 7,880,084 B2 | 2/2011 | Adducci et al. |
| 7,881,057 B2 | 2/2011 | Fink et al. |
| 7,894,190 B2 | 2/2011 | Davis et al. |
| 7,895,855 B2 | 3/2011 | Gooch |
| 7,952,869 B2 | 5/2011 | Lewis, II et al. |
| 7,957,139 B2 | 6/2011 | Davis et al. |
| 7,974,105 B2 | 7/2011 | Dean, Jr. et al. |
| 8,035,965 B2 | 10/2011 | Adducci et al. |
| 8,040,673 B2 | 10/2011 | Krietzman |
| 8,087,979 B2 | 1/2012 | Rasmussen |
| 8,107,238 B2 | 1/2012 | Krietzman et al. |
| 8,257,155 B2 | 9/2012 | Lewis, II |
| 8,395,046 B2 | 3/2013 | Nicewicz et al. |
| 8,403,736 B2 | 3/2013 | Rasmussen et al. |
| 8,405,984 B2 | 3/2013 | Donowho et al. |
| 8,411,465 B2 | 4/2013 | Dean, Jr. et al. |
| 8,437,147 B2 | 5/2013 | Dean, Jr. et al. |
| 8,523,643 B1 * | 9/2013 | Roy .......................... G06F 1/20 454/184 |
| 8,628,158 B2 | 1/2014 | Caveney |
| 8,653,363 B2 | 2/2014 | Behrens et al. |
| 8,701,737 B2 * | 4/2014 | Mainers ............. H05K 7/20745 160/1 |
| 8,730,665 B2 | 5/2014 | Lewis, II et al. |
| 9,072,193 B1 | 6/2015 | Eichelberg |
| 9,072,200 B2 | 6/2015 | Dersch et al. |
| 9,204,577 B2 | 12/2015 | Noteboom et al. |
| 9,313,927 B2 | 4/2016 | Krietzman |
| 9,380,735 B2 * | 6/2016 | Chang ................ H05K 7/20836 |
| 2001/0029163 A1 * | 10/2001 | Spinazzola ........ H05K 7/20745 454/184 |
| 2002/0101721 A1 | 8/2002 | Blood |
| 2003/0020379 A1 | 1/2003 | Larsen et al. |
| 2004/0007348 A1 | 1/2004 | Stoller |
| 2004/0050808 A1 | 3/2004 | Krampotich et al. |
| 2004/0099747 A1 | 5/2004 | Johnson et al. |
| 2004/0182799 A1 | 9/2004 | Tachibana |
| 2004/0190270 A1 | 9/2004 | Aldag et al. |
| 2004/0201335 A1 | 10/2004 | Davis |
| 2005/0029910 A1 | 2/2005 | Woods |
| 2005/0168945 A1 | 8/2005 | Coglitore |
| 2005/0170770 A1 | 8/2005 | Johnson et al. |
| 2005/0225936 A1 | 10/2005 | Day |

(56) References Cited

U.S. PATENT DOCUMENTS

| | | | |
|---|---|---|---|
| 2005/0235671 A1* | 10/2005 | Belady | F24F 3/06 62/259.2 |
| 2005/0248043 A1 | 11/2005 | Bettridge et al. | |
| 2005/0259383 A1 | 11/2005 | Ewing | |
| 2006/0082263 A1 | 4/2006 | Rimler et al. | |
| 2006/0103270 A1 | 5/2006 | Bergesch et al. | |
| 2006/0139877 A1 | 6/2006 | Germagian et al. | |
| 2006/0141921 A1 | 6/2006 | Turek et al. | |
| 2006/0260338 A1 | 11/2006 | VanGilder et al. | |
| 2006/0276121 A1 | 12/2006 | Rasmussen | |
| 2007/0064389 A1 | 3/2007 | Lewis, II et al. | |
| 2007/0064391 A1 | 3/2007 | Lewis, II et al. | |
| 2007/0129000 A1 | 6/2007 | Rasmussen et al. | |
| 2007/0171610 A1 | 7/2007 | Lewis | |
| 2007/0171613 A1 | 7/2007 | McMahan et al. | |
| 2007/0173189 A1 | 7/2007 | Lewis | |
| 2007/0210679 A1 | 9/2007 | Adducci et al. | |
| 2007/0210680 A1 | 9/2007 | Appino et al. | |
| 2007/0210681 A1 | 9/2007 | Adducci et al. | |
| 2007/0210683 A1 | 9/2007 | Adducci et al. | |
| 2007/0210686 A1 | 9/2007 | Adducci et al. | |
| 2007/0221393 A1 | 9/2007 | Adducci et al. | |
| 2007/0293138 A1 | 12/2007 | Adducci et al. | |
| 2008/0002358 A1 | 1/2008 | Casebolt | |
| 2008/0035810 A1 | 2/2008 | Lewis, II | |
| 2008/0037228 A1 | 2/2008 | Lewis, II | |
| 2008/0062654 A1 | 3/2008 | Mattlin et al. | |
| 2008/0067904 A1 | 3/2008 | Adducci et al. | |
| 2008/0068791 A1 | 3/2008 | Ebermann | |
| 2008/0074849 A1 | 3/2008 | Adducci et al. | |
| 2008/0148643 A1 | 6/2008 | Lemming | |
| 2008/0174217 A1 | 7/2008 | Walker | |
| 2008/0266789 A1 | 10/2008 | Hruby et al. | |
| 2008/0285232 A1 | 11/2008 | Claassen et al. | |
| 2008/0316702 A1 | 12/2008 | Donowho et al. | |
| 2008/0316703 A1 | 12/2008 | Donowho et al. | |
| 2009/0059523 A1 | 3/2009 | Mallia et al. | |
| 2009/0129013 A1 | 5/2009 | Donowho et al. | |
| 2009/0168345 A1 | 7/2009 | Martini | |
| 2009/0173017 A1* | 7/2009 | Hall | H05K 7/20745 52/69 |
| 2009/0190307 A1 | 7/2009 | Krietzman | |
| 2009/0227197 A1 | 9/2009 | Lewis, II et al. | |
| 2009/0239460 A1 | 9/2009 | Lucia et al. | |
| 2009/0239461 A1 | 9/2009 | Lewis, II et al. | |
| 2009/0241578 A1 | 10/2009 | Carlson et al. | |
| 2009/0273915 A1 | 11/2009 | Dean, Jr. et al. | |
| 2009/0277605 A1 | 11/2009 | VanGilder et al. | |
| 2010/0061057 A1 | 3/2010 | Dersch et al. | |
| 2010/0061059 A1 | 3/2010 | Krietzman et al. | |
| 2010/0172092 A1 | 7/2010 | Davis et al. | |
| 2010/0172093 A1 | 7/2010 | Davis et al. | |
| 2010/0188816 A1 | 7/2010 | Bean et al. | |
| 2010/0216388 A1 | 8/2010 | Tresh et al. | |
| 2010/0248610 A1 | 9/2010 | Caveney et al. | |
| 2010/0304657 A1 | 12/2010 | Gallmann et al. | |
| 2010/0307716 A1 | 12/2010 | Bean et al. | |
| 2011/0019362 A1 | 1/2011 | Krietzman | |
| 2011/0148261 A1 | 6/2011 | Donowho et al. | |
| 2011/0211328 A1 | 9/2011 | Dean, Jr. et al. | |
| 2011/0211329 A1 | 9/2011 | Dean, Jr. et al. | |
| 2011/0271610 A1 | 11/2011 | Cottuli et al. | |
| 2011/0278999 A1 | 11/2011 | Caveney et al. | |
| 2011/0287704 A1 | 11/2011 | Lewis, II et al. | |
| 2011/0290553 A1 | 12/2011 | Behrens et al. | |
| 2012/0013229 A1 | 1/2012 | Krietzman | |
| 2012/0112612 A1 | 5/2012 | Krietzman | |
| 2012/0181906 A1 | 7/2012 | Caveney | |
| 2013/0029579 A1 | 1/2013 | Lewis, II | |
| 2013/0160271 A1 | 6/2013 | Krietzman et al. | |
| 2013/0165035 A1 | 6/2013 | Krietzman et al. | |
| 2013/0210335 A1 | 8/2013 | Krietzman et al. | |
| 2014/0196394 A1 | 7/2014 | Greeson et al. | |
| 2015/0250077 A1 | 9/2015 | Endo et al. | |
| 2016/0088773 A1 | 3/2016 | Greeson et al. | |

FOREIGN PATENT DOCUMENTS

| | | |
|---|---|---|
| DE | 20207426 U1 | 9/2002 |
| EP | 2205054 A1 | 7/2010 |
| GB | 2354066 A | 3/2001 |
| GB | 2366084 B | 9/2002 |
| JP | 2000-286580 | 10/2000 |
| JP | 2004-200594 | 7/2004 |
| JP | 2004-252758 | 9/2004 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |
| WO | 2010028384 A3 | 5/2010 |
| WO | 2010117699 A1 | 10/2010 |
| WO | 2011088430 A2 | 7/2011 |
| WO | 2011088438 A2 | 7/2011 |
| WO | 2011088438 A3 | 11/2011 |

OTHER PUBLICATIONS

DCR Product Brochure, accessed at www.datacenterinarow.com, on or about Mar. 2011 (25 pages).

DCR Product Brochure—Configuration Options, accessed at www.datacenterinarow.com, on or about Mar. 2011 (4 pages).

DCR Product Brochure—Top Ten Features, accessed at www.datacenterinarow.com, on or about Mar. 2011 (9 pages).

DCR Product Brochure—Self-Contained Data Center Configurations, accessed at www.datacenterinarow.com, on or about Mar. 2011 (2 pages).

DCR Product Brochure—Self-Contained Data Center Features, accessed at www.datacenterinarow.com, on or about Mar. 2011 (2 pages).

HP 10000 G2 42U Rack Air Duct Installation Guide, Hewlett-Packard Development Company, LP, dated Aug. 2008 (23 pages).

Panduit Net-Access Vertical Exhaust System (VES) Specification Sheet, Panduit Corporation, dated Feb. 2011 (4 pages).

Panduit Net-Access Vertical Exhaust Duct (VED) Instructions, Panduit Corporation, dated 2009 (4 pages).

Chatsworth Products, Inc. "Cabinet Airflow Baffles—Air Dam Kit for CPI Cabinet Systems", Product Data Sheet, Jun. 2004, techsupport©chatsworth.com (2 pages).

Chatsworth Products, Inc., "Thermal Management Solutions", Signature Solutions Brochure, Revision dated Mar. 2008, accessed at www.chatsworth.com/passivecooling (6 pages).

Rasmussen, Neil, "Air Distribution Architecture Options for Mission Critical Facilities", White Paper #55, 2003, pp. 1-13, Revision 1, American Power Conversion (APC), West Kingston, Rhode Island.

\* cited by examiner

DATA PROCESSING EQUIPMENT STRUCTURE

CROSS REFERENCE TO RELATED APPLICATIONS

The present application is a U.S. non-provisional patent application of, and claims priority under 35 U.S.C. §119(e) to, U.S. provisional patent application Ser. No. 61/568,692, filed Dec. 9, 2011, which is expressly incorporated by reference herein in its entirety.

APPENDIX AND INCORPORATION THEREOF BY REFERENCE

Each of the following U.S. patent applications is expressly incorporated by reference herein in its entirety:
(a) U.S. provisional patent application Ser. No. 61/411,359, filed Nov. 8, 2010 and entitled "ADJUSTABLE WALL ASSEMBLY FOR HOT/COLD AISLE CONTAINMENT SYSTEM," a copy of which is attached hereto as Appendix A, which is likewise expressly incorporated by reference herein in its entirety; and
(b) U.S. non-provisional patent application Ser. No. 13/291,861, filed Nov. 8, 2011 and entitled "HEADER PANEL ASSEMBLY FOR PREVENTING AIR CIRCULATION ABOVE ELECTRONIC EQUIPMENT ENCLOSURE," published as U.S. Patent Application Publication No. US 2012/0112612 A1, which publication is likewise expressly incorporated by reference herein in its entirety.

The disclosure of each of the foregoing patent applications is intended to provide background and technical information with regard to the systems and environments of the inventions of the current provisional patent application.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND

Field

The present invention relates generally to structures for housing data processing equipment, and, in particular, to data processing equipment structures that provide enhanced airflow solutions.

Background

Racks, frames and enclosures for mounting and storing computer and other electronic components or equipment have been well known for many years. Racks and frames are typically simple rectangular frameworks on which electronic components may be mounted, or on which other mounting members, such as shelves or brackets, may be mounted which in turn may support the electronic components. Enclosures are typically frames on which panels or doors, or both, are hung to provide aesthetic improvement, to protect the components from external influences, to provide security for the components stored inside, or for other reasons.

Racks, frames and enclosures have been built in many different sizes and with many different proportions in order to best accommodate the components which they are designed to support and store. Components stored in these enclosures may include audio and video equipment and the like, but quite frequently include computer equipment and related peripheral devices. These components typically include housings enclosing internal operative elements.

As is also well known, the electronic equipment mounted in these structures tends to generate large amounts of thermal energy that needs to be exhausted away from the equipment effectively in order to maintain the equipment in proper operating order or to prevent damage thereto. The problem can be especially significant when the components are enclosed in enclosures, because thermal energy generated thereby can concentrate within the equipment enclosure and cause the components to overheat and shut down. As equipment becomes more densely packed with electronics, the quantities of thermal energy have continued to increase in recent years, and thermal energy management has become a significant issue confronting today's rack, enclosure, frame and enclosure manufacturers, the manufacturers of the electronic equipment, and the users of such equipment.

Typically, multiple racks, frames, enclosures, and the like (sometimes collectively referred to hereinafter as "enclosures") are housed together in a data center room. Because of the overheating problem, and particularly with multiple enclosures being placed in a single room, thermal management of the data center room is very important. A goal of data center thermal management is to maximize the performance, uptime and life expectancy of the active components being housed in the room. Toward this end, data center rooms are often arranged so as to increase efficiency and optimize performance.

One common way of organizing a data center room to meet these objectives involves arranging individual enclosures in rows, with the air intake of each enclosure facing toward one side of the row and the heated air exhaust of each enclosure facing toward the other side of the row. Rows of enclosures are arranged in back-to-back relationship so that enclosures of two separate rows exhaust heated air into a common "hot" aisle between the rows. Heated exhaust air from the hot aisle is then drawn into a cooling unit—often arranged as an in-line unit within the row of enclosures. The cooled air is then deposited back into the ambient space of the data center room to be re-used in the cooling process.

In such an arrangement, however, several drawbacks are known to exist. For instance, the establishment of a hot aisle between rows eliminates the possibility of having dedicated cooling units to manage the cooling process for each row individually. Additionally, under existing hot aisle methodology, the entire space of the data center room must be kept cool in order to provide a ready supply of cooled air available to the enclosure intakes. Due to its typically large volume, the data center room is generally incapable of being adequately pressurized.

Accordingly, a need exists for improvement in the arrangement of equipment enclosures within a data center room so as to further enhance efficiency and performance. This, and other needs, is addressed by one or more aspects of the present invention.

SUMMARY

Broadly defined, the present invention according to a first aspect includes a data processing equipment structure that includes a plurality of sidewalls and a ceiling panel, which, together, define an enclosed space. The structure further includes at least one equipment enclosure and at least one cooling unit arranged in side-to-side relationship in a row within the enclosed space. At least one separation panel divides the enclosed space into a front plenum at a front side of the row and a rear plenum at a rear side of the row. Cool air in the front plenum is isolated from heated exhaust air in the rear plenum.

In features of this aspect, the volume of the front plenum may be less than half of the volume of the enclosed space; and the front plenum may be pressurized.

In other features of this aspect, the at least one equipment enclosure may be a plurality of equipment enclosures; the at least one cooling unit may be located at an end of the row; the at least one cooling unit may be located intermediately within the row; the at least one cooling unit may be a plurality of cooling units; and the cooling units may be located within the row proximate to equipment enclosures that house electronic equipment that requires cooling.

In still another feature of this aspect, the data processing equipment structure further includes an internal sidewall for scaling the size of the enclosed space.

Broadly defined, the present invention according to a second aspect includes a data processing equipment structure substantially as shown and described.

Broadly defined, the present invention according to a third aspect includes a data processing equipment structure that includes at least one equipment enclosure and at least one cooling unit arranged in side-to-side relationship in a row. The structure further includes an overhead duct in fluid communication with the at least one equipment enclosure and the at least one cooling unit. The overhead duct is adapted for containing and directing airflow between the at least one equipment enclosure and the at least one cooling unit.

In features of this aspect, the overhead duct may contain heated air exhausted from the equipment enclosures; and the overhead duct may contain a supply of cool air.

Broadly defined, the present invention according to a fourth aspect includes a data processing equipment structure that includes a pair of rows of equipment enclosures defining an aisle between the rows and at least one cooling unit above the aisle. The equipment enclosures are arranged in side-to-side relationship within each row. The structure further includes an overhead duct in fluid communication with the equipment enclosures of each row and the at least one cooling unit. The overhead duct is adapted for containing and directing airflow between the equipment enclosures and the at least one cooling unit.

In features of this aspect, enclosures of each row may be arranged such that cool air intakes face toward the aisle; and the aisle may contain a supply of cool air.

In other features of this aspect, enclosures of each row may be arranged such that heated air is exhausted toward the aisle; and the aisle may contain heated air exhausted from the equipment enclosures.

Broadly defined, the present invention according to a fifth aspect includes a data processing equipment structure that includes at least one equipment enclosure and at least one cooling unit arranged in side-to-side relationship in a row. The structure further includes a duct arranged underneath, and in fluid communication with, each of the at least one equipment enclosure and the at least one cooling unit. The duct is adapted for containing and directing airflow between the at least one equipment enclosure and the at least one cooling unit.

In features of this aspect, the duct may contain heated air exhausted from the equipment enclosures; and the duct may contain a supply of cool air.

Broadly defined, the present invention according to a sixth aspect includes a data processing equipment structure that includes a pair of rows of equipment enclosures defining an aisle between the rows and at least one cooling unit beneath the aisle. The equipment enclosures are arranged in side-to-side relationship within each row. The structure further includes a duct arranged underneath, and in fluid communication with, the equipment enclosures of each row and the at least one cooling unit. The duct is adapted for containing and directing airflow between the equipment enclosures and the at least one cooling unit.

In features of this aspect, enclosures of each row may be arranged such that cool air intakes face toward the aisle; and the aisle may contain a supply of cool air.

In other features of this aspect, enclosures of each row may be arranged such that heated air is exhausted toward the aisle; and the aisle may contain heated air exhausted from the equipment enclosures.

Broadly defined, the present invention according to a seventh aspect includes a data processing equipment structure that includes at least one equipment enclosure and at least one cooling unit arranged in side-to-side relationship in a row. The structure further includes a duct, arranged at a side of the row, in fluid communication with the at least one equipment enclosure and the at least one cooling unit. The duct is adapted for containing and directing airflow between the at least one equipment enclosure and the at least one cooling unit.

In features of this aspect, the duct may contain heated air exhausted from the equipment enclosures; the duct may contain a supply of cool air; the data processing equipment structure may further include an overhead duct in fluid communication with the at least one equipment enclosure and the at least one cooling unit; and the data processing equipment structure may further include an underneath duct in fluid communication with the at least one equipment enclosure and the at least one cooling unit.

Broadly defined, the present invention according to an eighth aspect includes a data processing equipment arrangement that includes a plurality of data processing equipment structures. Each data processing equipment structure includes at least one equipment enclosure and at least one cooling unit arranged in side-to-side relationship in a row. Each data processing equipment structure further includes a duct in fluid communication with the at least one equipment enclosure and the at least one cooling unit. The duct is adapted for containing and directing airflow between the at least one equipment enclosure and the at least one cooling unit.

In features of this aspect, the duct of each structure may be an overhead duct; the duct of each structure may be an underneath duct; the duct of each structure may be arranged at a side of each row; and adjacent data processing equipment structures may have a shared sidewall.

Broadly defined, the present invention according to a ninth aspect includes a data processing equipment arrangement, which includes a plurality of data processing equipment structures, substantially as shown and described.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
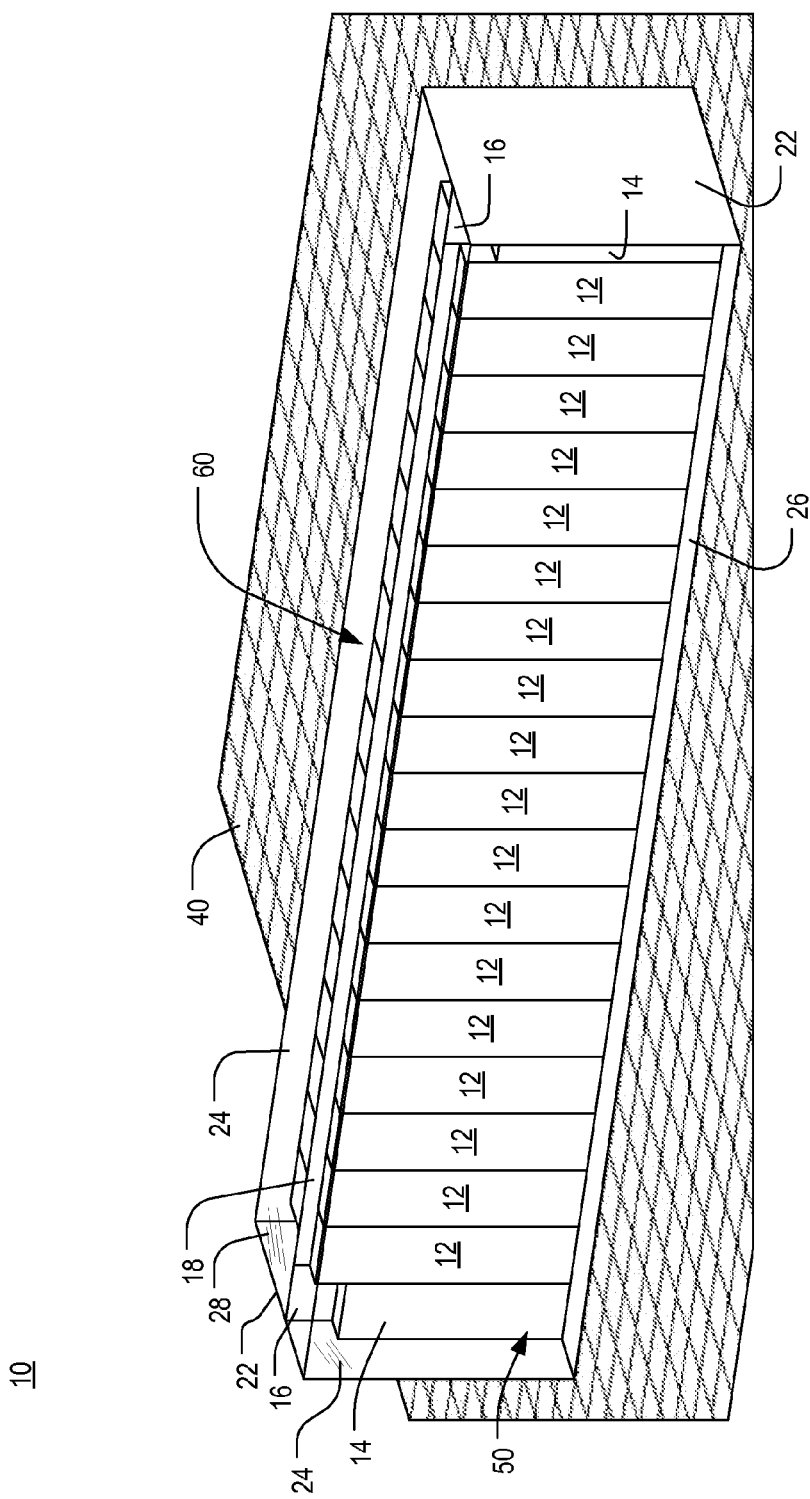
FIG. 1 is a front orthogonal view of a data processing equipment structure, in accordance with one or more aspects of the present invention, shown with cooling units disposed at ends of a row of equipment enclosures.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

Figure 2:
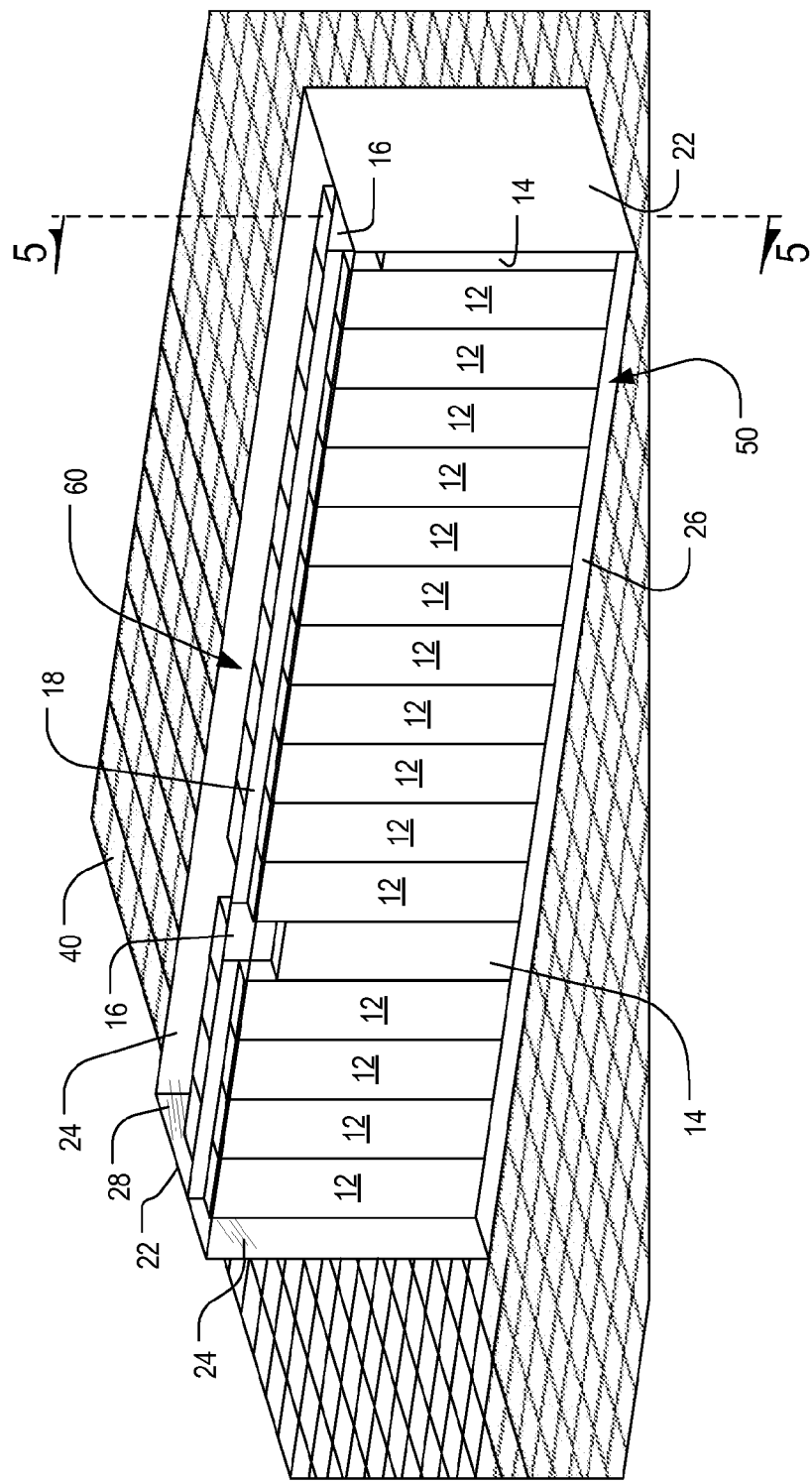
FIG. 2 is a front orthogonal view of a data processing equipment structure, in accordance with one or more aspects of the present invention, shown with cooling units disposed at an end and intermediate of ends of a row of equipment enclosures.

FIG. 1 is a front orthogonal view of a data processing equipment structure 10, in accordance with one or more aspects of the present invention, shown with cooling units 14 disposed at ends of a row of equipment enclosures 12. FIG. 2 is a front orthogonal view of a data processing equipment structure 10, in accordance with one or more aspects of the present invention, shown with cooling units 14 disposed at an end and intermediate of ends of a row of equipment enclosures 12. As used herein, the term "data processing equipment" refers to a wide range of electronic equipment as well as racks, frames, enclosures, and the like that are typically used to house such equipment.

As shown in FIGS. 1 and 2, the data processing equipment structure 10 generally includes sidewalls 22,24 and a ceiling panel 28. Together, the sidewalls 22,24 and ceiling panel 28 enclose a row of enclosures 12 resting on a floor surface 40 in a data center room. In a preferred embodiment, the sidewalls 22,24 and ceiling panel 28 are solid so as to prevent mixing of air from outside the structure 10 with the controlled environment within. Although not a required feature, the structure 10 may optionally include a floor panel 26 resting on or above the floor surface 40 such that the row of enclosures 12 rests on the floor panel 26. In FIGS. 1 and 2, the front sidewall 24 and ceiling panel 28 are shown as being transparent in order to illustrate the row of enclosures 12 contained within the structure 10, while the other walls are shown as being opaque. In fact, any of the panels may be transparent or opaque as desired.

As further shown in FIGS. 1 and 2, one or more in-line cooling units 14 are arranged within the row of enclosures 12. In FIG. 1, a cooling unit 14 is disposed at each of the two ends of the row of enclosures 12. However, there may also be a need to include a cooling unit 14 intermediate of the ends of a row of enclosures 12, as shown in FIG. 2. While two cooling units 14 are depicted in each of FIGS. 1 and 2, more or less cooling units 14 may be included, as might be appreciated by the Ordinary Artisan. Cooling units 14 are generally, though perhaps not always, disposed proximate to enclosures 12 that house equipment in need of cooling. Because all enclosures 12 may not be in use at all times, the location of the cooling units 14 within the row can be matched with enclosures 12 that are in use. Enclosures 12 house a wide variety of electronic equipment, including storage equipment, servers, switches and other like devices and equipment for data processing. Cooling units 14 embedded within the row may utilize a wide variety of cooling solutions, including DX cooling, chilled water cooling and other types of economized cooling solutions.

Figure 3:
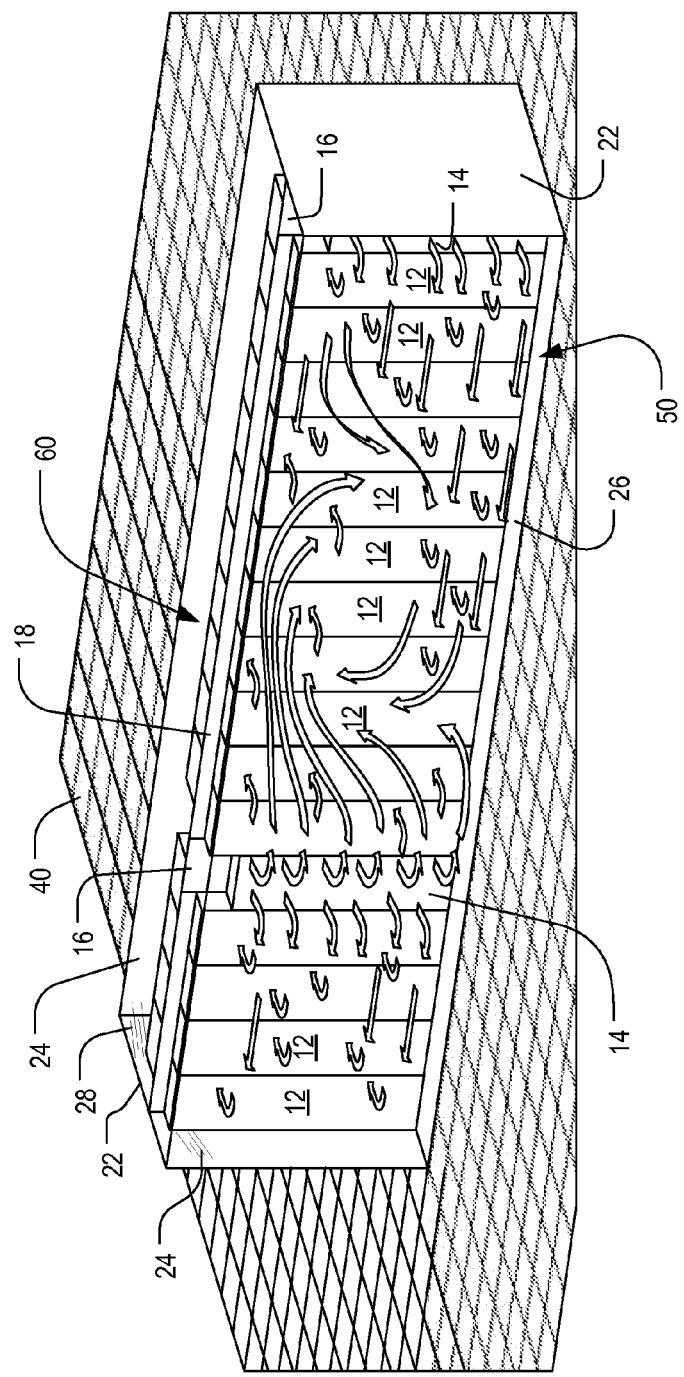
FIGS. 3 and 4 are respective front and rear orthogonal views of the data processing equipment structure of FIG. 2, shown with circulation lines or arrows illustrating airflow.
Figure 4:
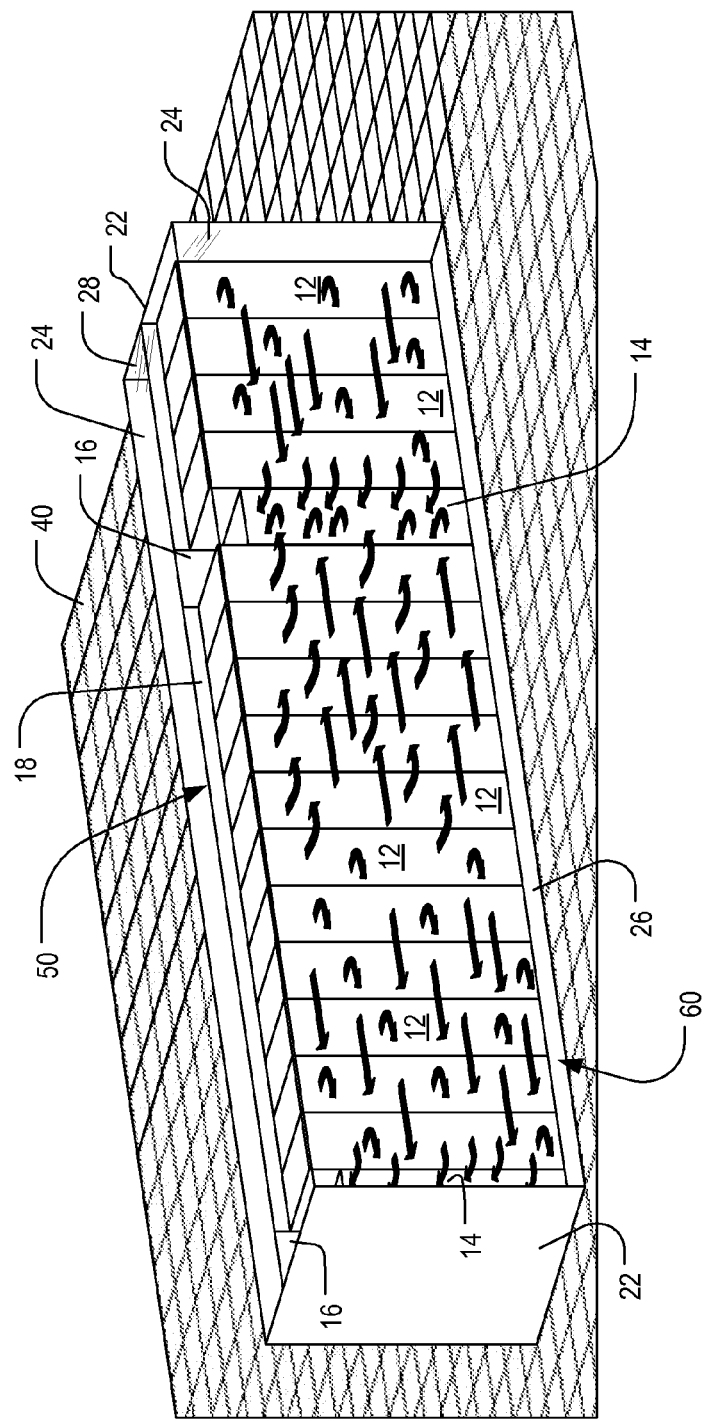
Figure 5:
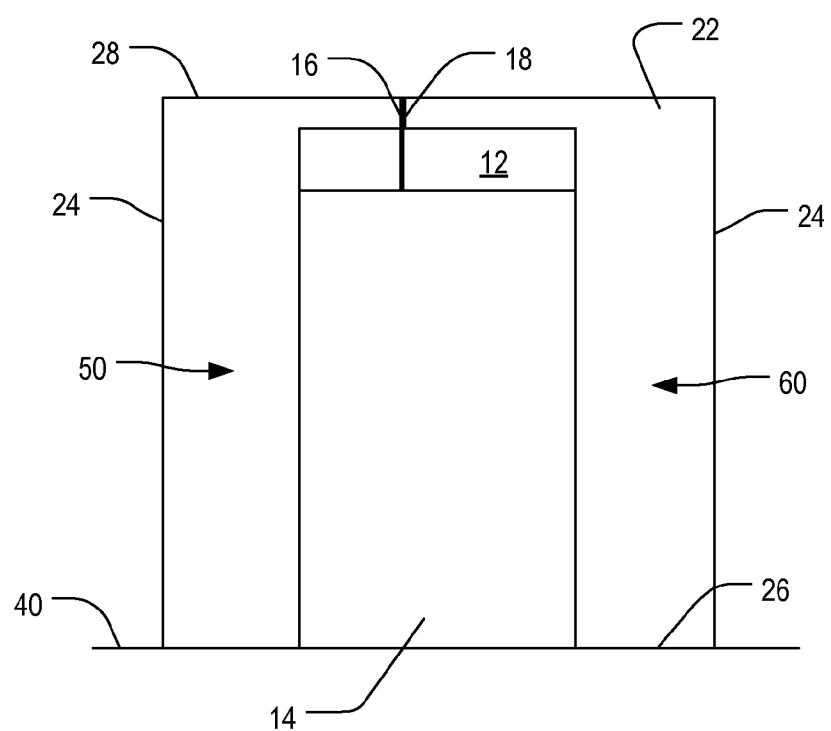
FIG. 5 is a sectional view of the data processing equipment structure of FIG. 2, taken along line 5-5.

FIGS. 3 and 4 are respective front and rear orthogonal views of the data processing equipment structure 10 of FIG. 2, shown with circulation lines or arrows illustrating airflow. The front sidewall 24 and ceiling panel 28 in FIG. 3 and the rear sidewall 24 and ceiling panel 28 in FIG. 4 are shown as being transparent in order to illustrate the row of enclosures 12 contained within the structure 10. FIG. 5 is a sectional view of the data processing equipment structure of FIG. 2, taken along line 5-5. As collectively shown therein, the structure 10 is divided or compartmentalized to define a front plenum 50 at or along the front side of the row of enclosures 12 and a rear plenum 60 at or along a rear side of the row of enclosures 12. In the arrangement shown, the front plenum 50 houses the cool air supply of the structure 10 provided by the cooling units 14 and is in fluid connection with the air intakes of the various enclosures 12, while the rear plenum 60 contains heated exhaust air exhausted from equipment mounted within the enclosures 12 and is in fluid connection with the air intakes of the cooling units 14. However, it will be appreciated that this arrangement may be reversed such that the rear plenum 60 houses the cool air supply and the front plenum 50 contains the heated exhaust air.

The front plenum 50 and rear plenum 60 are separated from one another by the enclosures 12 and the cooling units 14 in combination with one or more separation panels 16,18. As perhaps best shown in FIG. 5, separation panels 16 extend from the tops of the air cooling units 14 to the ceiling panel 28, and separation panels 18 extend from the tops of the enclosures 12 to the ceiling panel 28. Separation panels 16,18 thus ensure that the cool air supply of the front plenum 50 is isolated from the heated exhaust air of the rear plenum 60.

As shown in FIG. 3, cool air (represented by arrows shown in outline form) enters the front plenum 50 via the cooling units 14 and is dispersed within the front plenum 50. Separation panels 16,18 prevent the cool air in the front plenum 50 from mixing with the heated exhaust air in the rear plenum 60. Cool air is then drawn into the air intakes of the enclosures 12 to cool equipment mounted therein. Conveniently, the cooling units 14 may be arranged within the row at locations proximate to enclosures 12 that house equipment to be cooled.

As shown in FIG. 4, heated exhaust air (represented by arrows shown in solid form) is exhausted from the rear sides of the enclosures 12 into the rear plenum 60. Heated exhaust air is contained within the rear plenum 60, separate from both the front plenum 50 and any other rows of electronic equipment within the data center room. From the rear plenum 60, heated exhaust air is drawn into the air intakes of the cooling units 14 where it is cooled before being reintroduced into the front plenum 50 as cooled air.

Figure 6:
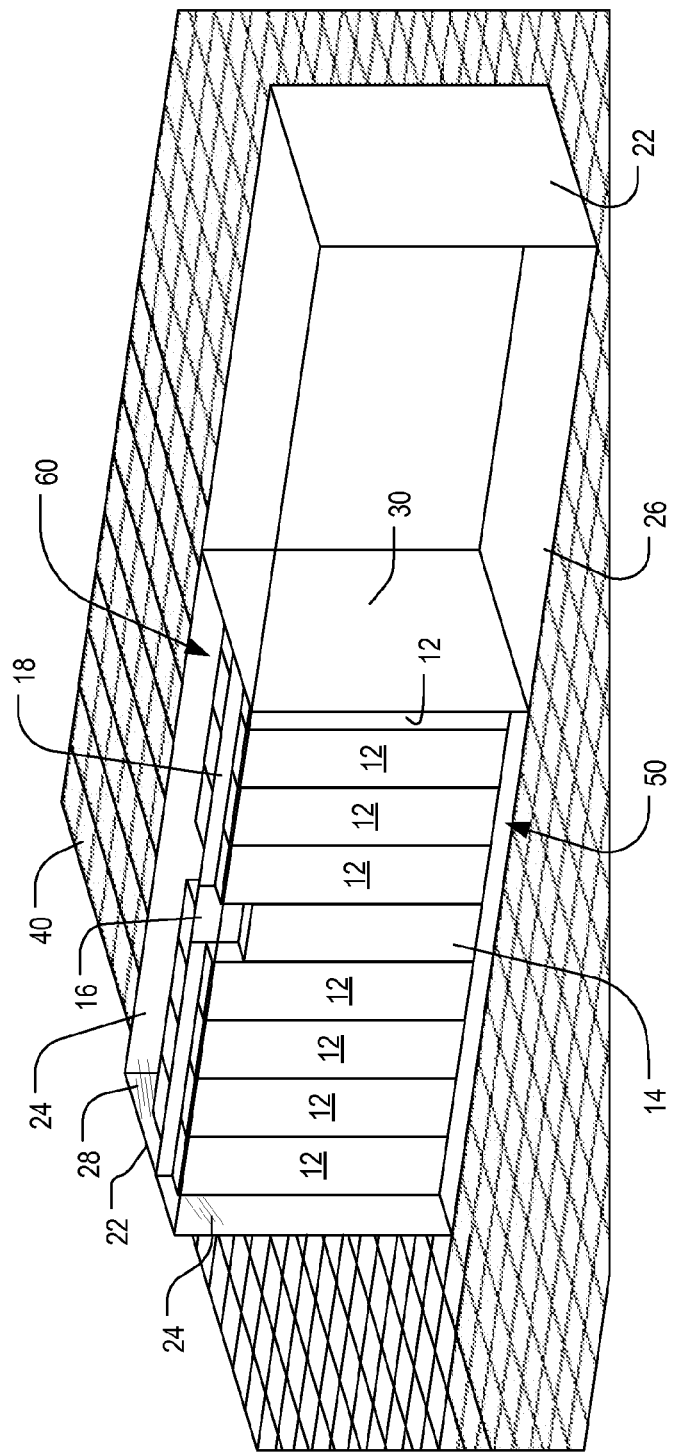
FIG. 6 is a front orthogonal view of a data processing equipment structure, in accordance with one or more aspects of the present invention, shown with an internal sidewall to scale the size of the internal space for housing equipment enclosures.

FIG. 6 is a front orthogonal view of a data processing equipment structure 10, in accordance with one or more aspects of the present invention, shown with an internal sidewall 30 to scale the size of the internal space for housing equipment enclosures 12. In FIG. 6, the front sidewall 24 and ceiling panel 28 are once again shown as being transparent in order to illustrate the row of enclosures 12 contained within the structure 10. As shown in FIG. 6, the structure 10 is capable of easy modification in order to suit the particular needs of a data center. More particularly, if only a few enclosures 12 are required for a particular data center, an internal sidewall 30 may be configured within the structure 10 to isolate any unneeded space (i.e., the space at the rightmost end of the structure 10 of FIG. 6) from actively used space (i.e., the space at the leftmost end of the structure 10 of FIG. 6) where electronic equipment is maintained. The internal sidewall 30 may be located in any of a number of different positions within the structure 10 so as to permit scaling the size of the structure 10 to a preferred size to accommodate more or less equipment enclosures 12. As such, the internal space of the structure 10 is capable of expansion or reduction in size to address particular needs of a data center.

In accordance with another aspect of the present invention, the structure 10 may be configured to provide additional scalability features. In particular, individual enclosures 12 within the row may be fitted with active and passive louvers (not shown) such that each individual enclosure 12 may be rendered active or inactive within the structure 10. Furthermore, it is also contemplated that individual enclosures 12 within the row may include solid caps (not shown) capable of being fitted to the front or rear of the respective enclosure 12, thereby covering the air intake or hot air exhaust of the respective enclosure 12. In this regard, individual enclosures 12 may be rendered inactive without the need of removing the enclosure from the structure 10.

As shown in FIGS. 1-6, the structure 10 provides an environment for thermal management of a row of equipment enclosures 12. Where the data center room includes multiple rows of equipment enclosures, thermal management of each individual row is possible in accordance with the present invention, as the supply of cool air in the front plenum 50 and heated exhaust air in the rear plenum 60 of a particular row can be effectively isolated from other rows. Each individual row of equipment enclosures 12 is capable of thermal management by one or more dedicated cooling units 14 within the row. As such, what is often a very complex air space within a data center room can be simplified in a manner such that each row is capable of being managed independently of other rows.

By limiting the air interaction between separate rows of electronic equipment 12, the methodology of the present invention simplifies control of the thermal management process. Cooling needs for each individual row can be ascertained, which facilitates the application of simple control algorithms to manage the process and maximize airflow and cooling efficiency of each row in the data center room. With enhanced airflow efficiency, cooling units can operate at a lower power state, thus enhancing power consumption of the structure 10 as well.

Separation of the front plenum 50 from the rear plenum 60 further enhances the energy efficiency of the structure 10 by reducing or minimizing wasted airflow arising from recirculation or bypass, which can ultimately increase the rate of heated air exhausted into the rear plenum 60 during the cooling process. Such an increase facilitates an improvement in the efficiency of cooling coils of the cooling units 14, which allows for a reduction in cooling unit fan speed. In this regard, a reduction in fan speed can reduce power consumption and thereby enhance the energy efficiency of the structure 10.

Energy efficiency of the structure 10 is also enhanced by the relatively short airflow path afforded by the structure 10. Cooling units 14 can be located within the row to be proximate to enclosures 12 that house electronic equipment. By coupling cooling units 14 with enclosures 12, the airflow path can be direct and short, thus providing a ready supply of cool air in the vicinity of the enclosure 12. Furthermore, as shown in FIGS. 1-6, the volume of the front plenum 50 is relatively small, which can facilitate a pressurized state. Such pressurization at the cool air intake of enclosures 12 can further enhance airflow through electronic equipment.

In accordance with various aspects of the present invention, power may be provided to the cooling units 14 and electronic equipment mounted within the enclosures 12 by means of a busway. Power may also be provided to the cooling units 14 and electronic equipment mounted within the enclosures 12 via conduit and junction boxes. In accordance with other aspects of the present invention, the structure 10 may be fitted with various integrated systems, such as security systems, fire suppression systems, lighting systems and general IT management operation systems. In this regard, the structure 10 of the present invention is capable of managing a multitude of functions for an individual row of enclosures 12, including thermal management, power, fire suppression and other critical functions.

It is further contemplated that multiple structures 10 can be organized within a single data center room, with each separate structure 10 being specifically configured to enhance or optimize thermal management with respect to equipment mounted therein.

Figure 7:
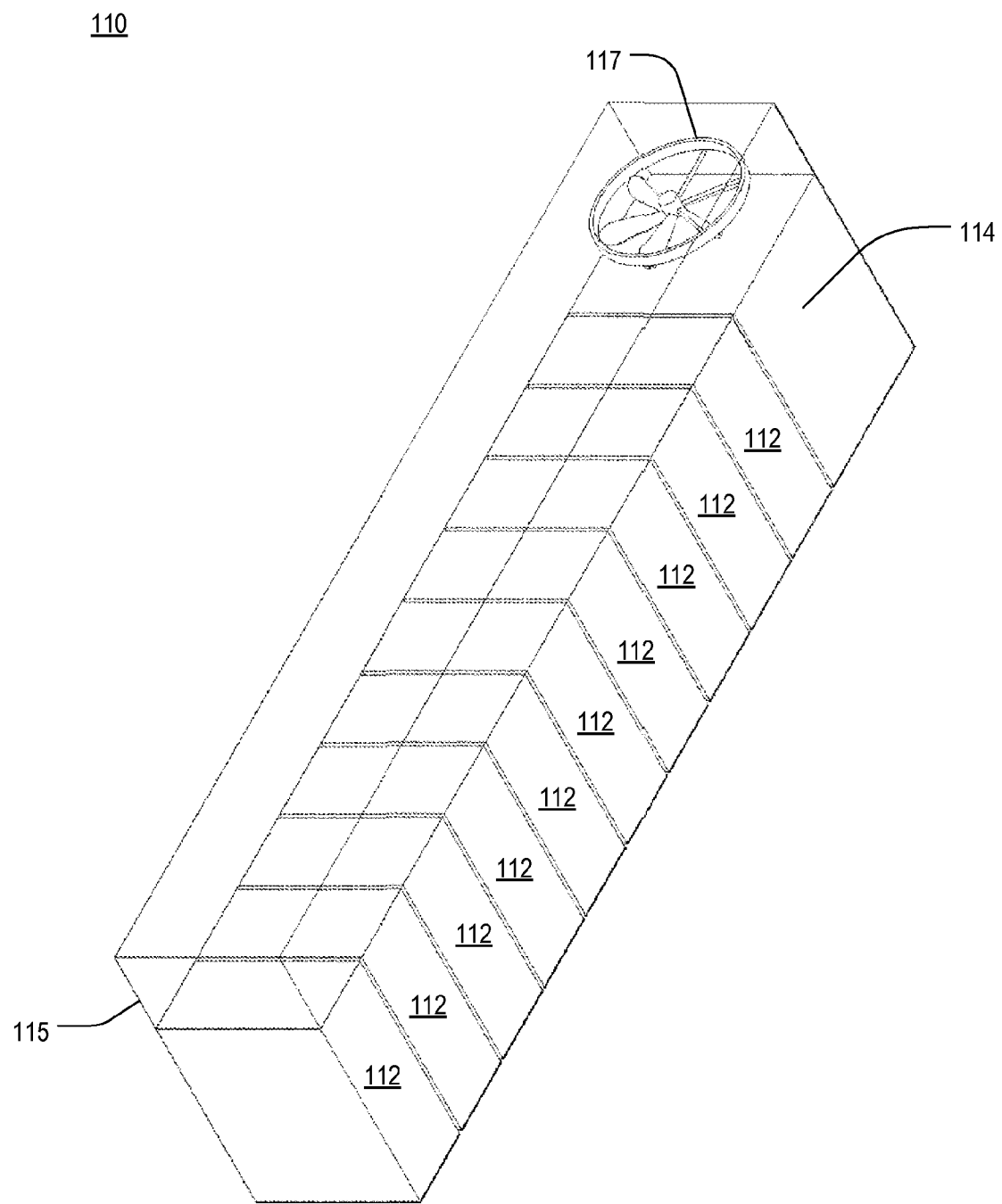
FIG. 7 is an isometric view of a second embodiment of a data processing equipment structure in accordance with one or more aspects of the present invention.

FIG. 7 is an isometric view of a second embodiment of a data processing equipment structure 110 in accordance with one or more aspects of the present invention. As shown therein, the data processing equipment structure 110 generally includes a plurality of equipment enclosures 112 organized in a row and at least one cooling unit 114. Although one cooling unit 114 is shown, it is contemplated that multiple cooling units 114 may be implemented within the row. The cooling unit 114 includes or operates in conjunction with a cooling fan 117 to assist in facilitating airflow during the cooling process. The structure 110 further includes an overhead duct 115 (shown as being transparent in FIG. 7) for containing and directing air during the cooling process. The overhead duct 115 is in fluid communication with the enclosures 112 and the cooling unit 114.

In accordance with this embodiment, airflow can be directed such that cool air is drawn into the enclosures 112 from the environment in which the structure 110 is organized. Cool air is utilized to cool equipment mounted in the enclosures 112 and is then exhausted into the overhead duct 115 as heated exhaust air. From the overhead duct 115, heated exhaust air may be directed toward the in-line cooling unit 114 where the heated exhaust air is cooled before being reintroduced to the supply of cool air outside of the structure 110.

Airflow can also be directed such that cool air is drawn into enclosures 112 from the overhead duct 115. In this arrangement, cool air is utilized to cool equipment mounted in the enclosures 112 and is then exhausted into the environment outside the structure 110 as heated exhaust air. The in-line cooling unit 114 then draws heated exhaust air from the exterior environment to be cooled before being reintroduced to the supply of cool air contained within the overhead duct 115.

Figure 8:
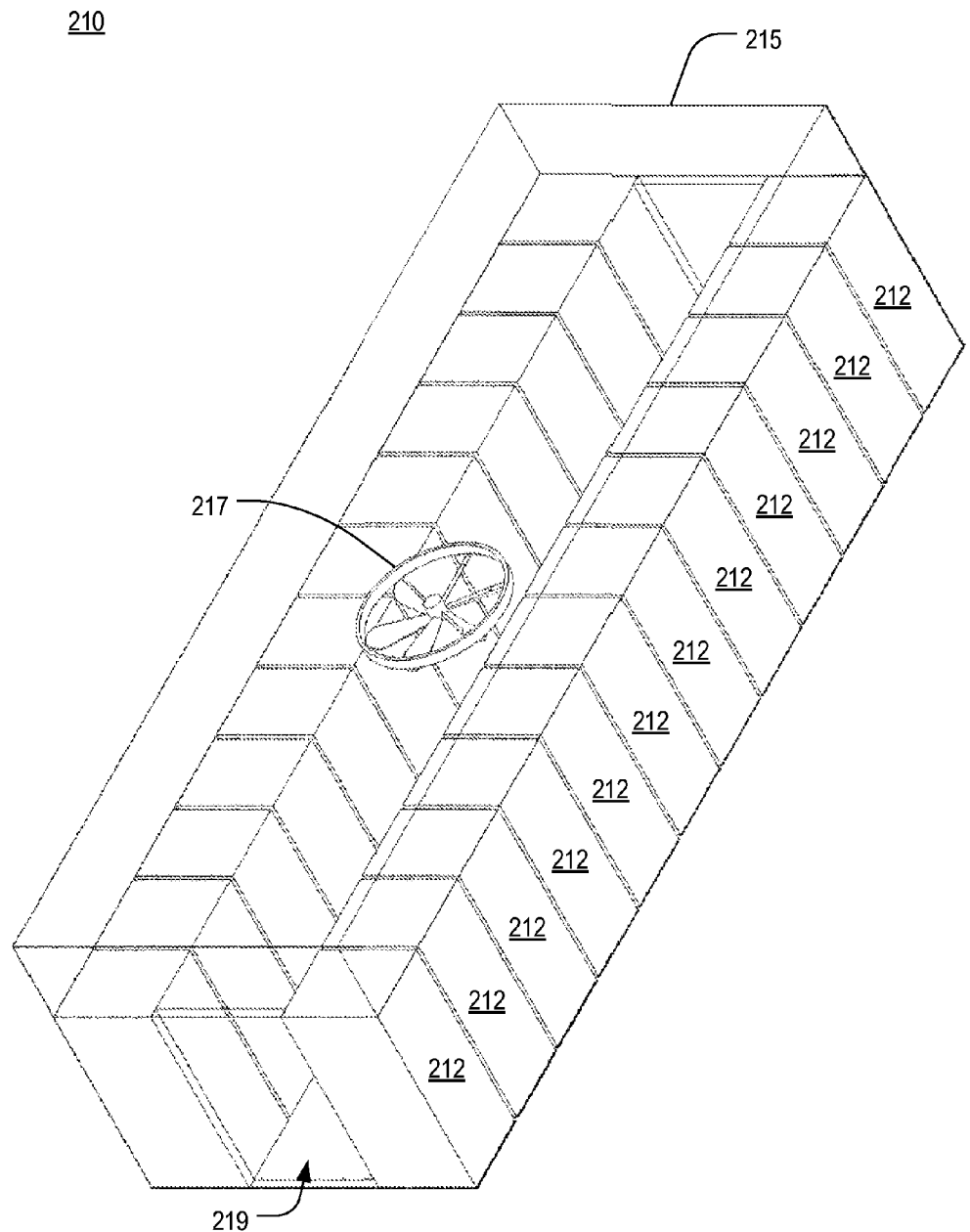
FIG. 8 is an isometric view of a third embodiment of a data processing equipment structure in accordance with one or more aspects of the present invention.

FIG. 8 is an isometric view of a third embodiment of a data processing equipment structure 210 in accordance with one or more aspects of the present invention. As shown therein, the data processing equipment structure 210 generally includes a pair of rows of equipment enclosures 212 that are arranged in side-to-side relationship. Together, the rows of enclosures 212 define an aisle 219 therebetween. The structure further includes a cooling unit/fan 217 above the aisle and an overhead duct 215 (shown as being transparent in FIG. 8) for containing and directing air during the cooling process. The overhead duct 215 is in fluid communication with the enclosures 212 and the cooling unit/fan 217. Although one cooling unit/fan 217 is shown, it is contemplated that multiple such units may be implemented above the aisle 219. It is further contemplated that one or more doors may be utilized to seal ends of the aisle 219 from the outside environment and provide access to the aisle 219 when necessary.

In accordance with this embodiment, airflow can be directed such that cool air is drawn into enclosures 212 from the aisle 219 between the rows. In this regard, enclosures 212 of each row may be arranged such that cool air intakes face toward the aisle 219, and the aisle 219 between the rows operates as a "cold" aisle for containing a supply of cool air. Cool air is utilized to cool equipment mounted in the enclosures 212 and is then exhausted into the overhead duct 215 as heated exhaust air. The cooling unit/fan 217 above the aisle 219 then draws heated exhaust air from the overhead duct 215 into the cooling unit/fan 217, where the heated exhaust air is cooled before being reintroduced to the supply of cool air contained within the aisle 219.

Airflow can also be directed such that cool air is drawn into the enclosures 212 from the overhead duct 215. In this arrangement, cool air is utilized to cool equipment mounted in the enclosures 212 and is then exhausted into the aisle between the rows of enclosures 212 as heated exhaust air. In this regard, enclosures 212 of each row may be arranged such that heated air is exhausted toward the aisle 219, and the aisle 219 between the rows operates as a "hot" aisle for containing heated air exhausted from the enclosures 212. From the aisle 219 between the rows, heated exhaust air may be directed toward the cooling unit/fan 217 above the aisle 219 where the heated exhaust air is cooled before being reintroduced to the supply of cool air contained within the overhead duct 215.

Figure 9:
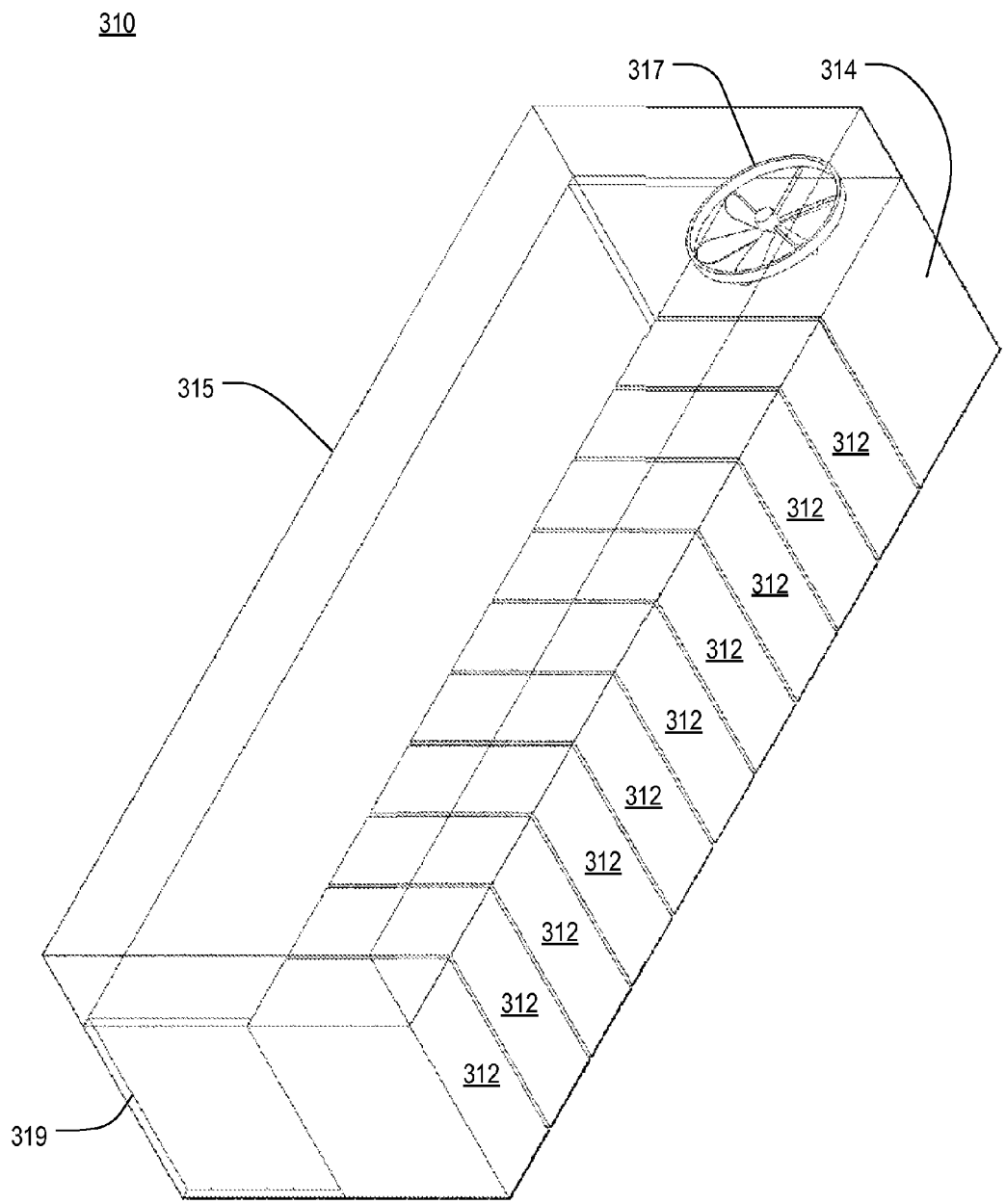
FIG. 9 is an isometric view of a fourth embodiment of a data processing equipment structure in accordance with one or more aspects of the present invention.

FIG. 9 is an isometric view of a fourth embodiment of a data processing equipment structure 310 in accordance with one or more aspects of the present invention. As shown therein, the data processing equipment structure 310 generally includes a plurality of equipment enclosures 312 organized in a row and at least one in-line cooling unit 314. Although just one cooling unit 314 is shown, it is contemplated that multiple cooling units 314 may be implemented within the row. The cooling unit 314 includes or operates in conjunction with a cooling fan 317 to assist in facilitating airflow during the cooling process. The structure 310 further includes an overhead duct 315 and a separate side duct 319 arranged at a side of the row, each being in fluid communication with the enclosures 312 and the cooling unit 314.

In accordance with this embodiment, airflow can be directed such that cool air is drawn into the enclosures 312 from the side duct 319, which may be configured to function as a reservoir for cool air. Cool air is utilized to cool equipment mounted in the enclosures 312 and is then exhausted into the overhead duct 315 at the side of the row as heated exhaust air. From the overhead duct 315, heated exhaust air may be directed toward the in-line cooling unit 314 where the heated exhaust air is cooled before being reintroduced to the supply of cool air contained within the side duct 319.

Airflow can also be directed such that cool air is drawn into the enclosures 312 from the overhead duct 315, which may be configured to function as a reservoir for cool air. Cool air is utilized to cool equipment mounted in the enclosures 312 and is then exhausted into the side duct 319 as heated exhaust air. From the side duct 319, heated exhaust air may be directed toward the in-line cooling unit 314 where the heated exhaust air is cooled before being reintroduced to the supply of cool air contained within the overhead duct 315.

Figure 10:
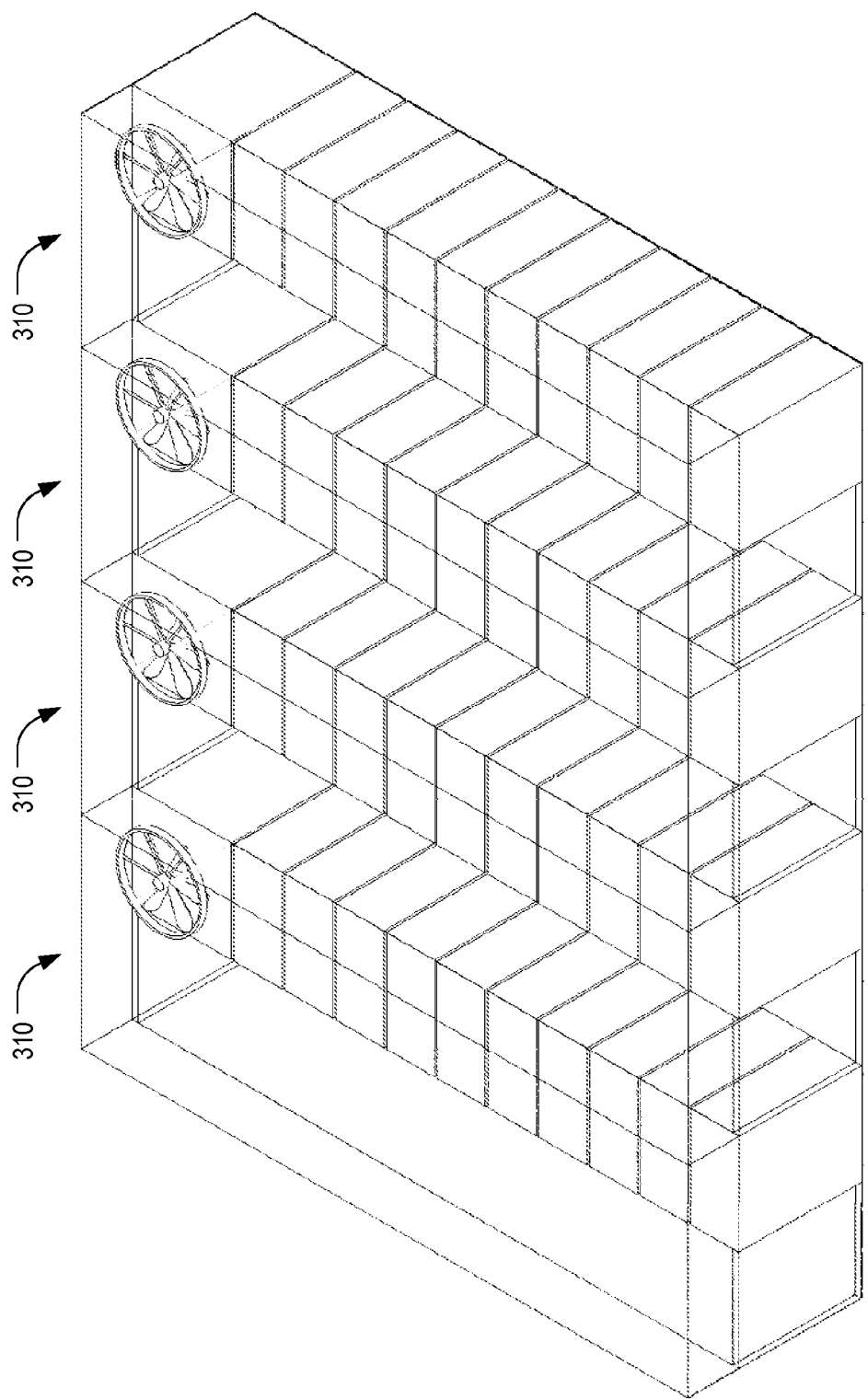
FIG. 10 is an isometric view of a plurality of the data processing equipment structures of FIG. 9, depicted in a side-to-side relationship.

FIG. 10 is an isometric view of a plurality of data processing equipment structures 310 of FIG. 9. As shown therein, multiple data processing equipment structures 310 may be arranged adjacent one another to define an overall arrangement within a data center room. In this regard, structures 310 adjacent to one another within the data center room are capable of sharing common walls.

Figure 11:
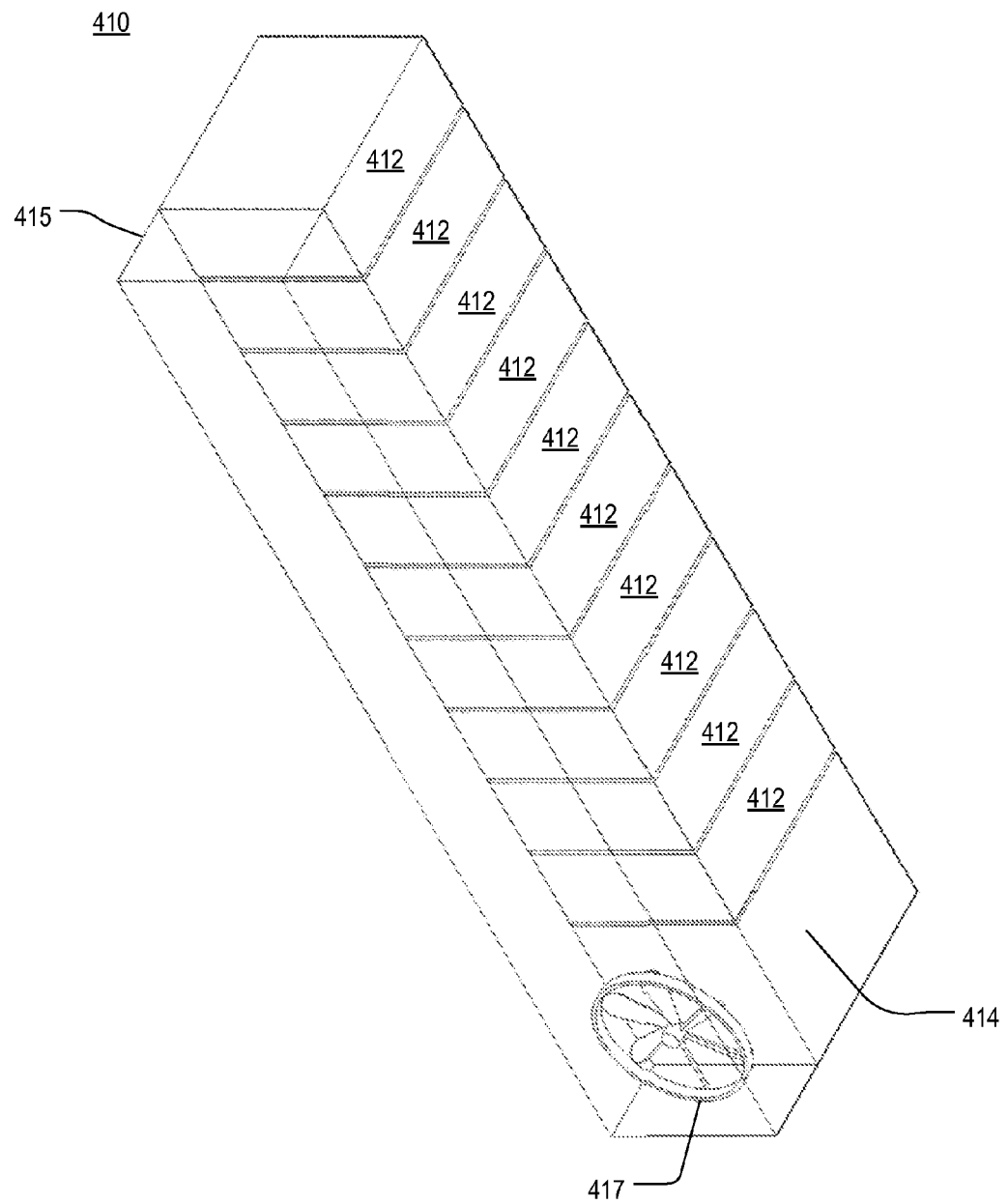
FIG. 11 is an isometric view of a fifth embodiment of a data processing equipment structure in accordance with one or more aspects of the present invention.

FIG. 11 is an isometric view of a fifth embodiment of a data processing equipment structure 410 in accordance with one or more aspects of the present invention. As shown therein, the data processing equipment structure 410 generally includes a plurality of equipment enclosures 412 organized in a row and at least one cooling unit 414. Although one cooling unit 414 is shown, it is contemplated that multiple cooling units 414 may be implemented within the row. The cooling unit 414 includes or operates in conjunction with a cooling fan 417 to assist in facilitating airflow during the cooling process. The structure 410 further includes a duct 415 located beneath the row of enclosures 412 and the cooling unit 414 (shown as being transparent in FIG. 11). The duct 415 is adapted to contain and direct air during the cooling process and is in fluid communication with the enclosures 412 and the cooling unit 414.

In accordance with this embodiment, airflow can be directed such that cool air is drawn into the enclosures 412 from the environment in which the structure 410 is organized. Cool air is utilized to cool equipment mounted in the enclosures 412 and is then exhausted into the duct 415 beneath the enclosures 412 as heated exhaust air. From the duct 415, heated exhaust air may be directed toward the in-line cooling unit 414 where the heated exhaust air is cooled before being reintroduced to the supply of cool air outside of the structure 410.

Airflow can also be directed such that cool air is drawn into enclosures 412 from the duct 415 beneath the enclosures 412. In this arrangement, cool air is utilized to cool equipment mounted in the enclosures 412 and is then exhausted into the environment outside the structure 410 as heated exhaust air. The in-line cooling unit 414 then draws heated exhaust air from the exterior environment to be cooled before being reintroduced to the supply of cool air contained within the duct 415 beneath the enclosures 412.

Figure 12:
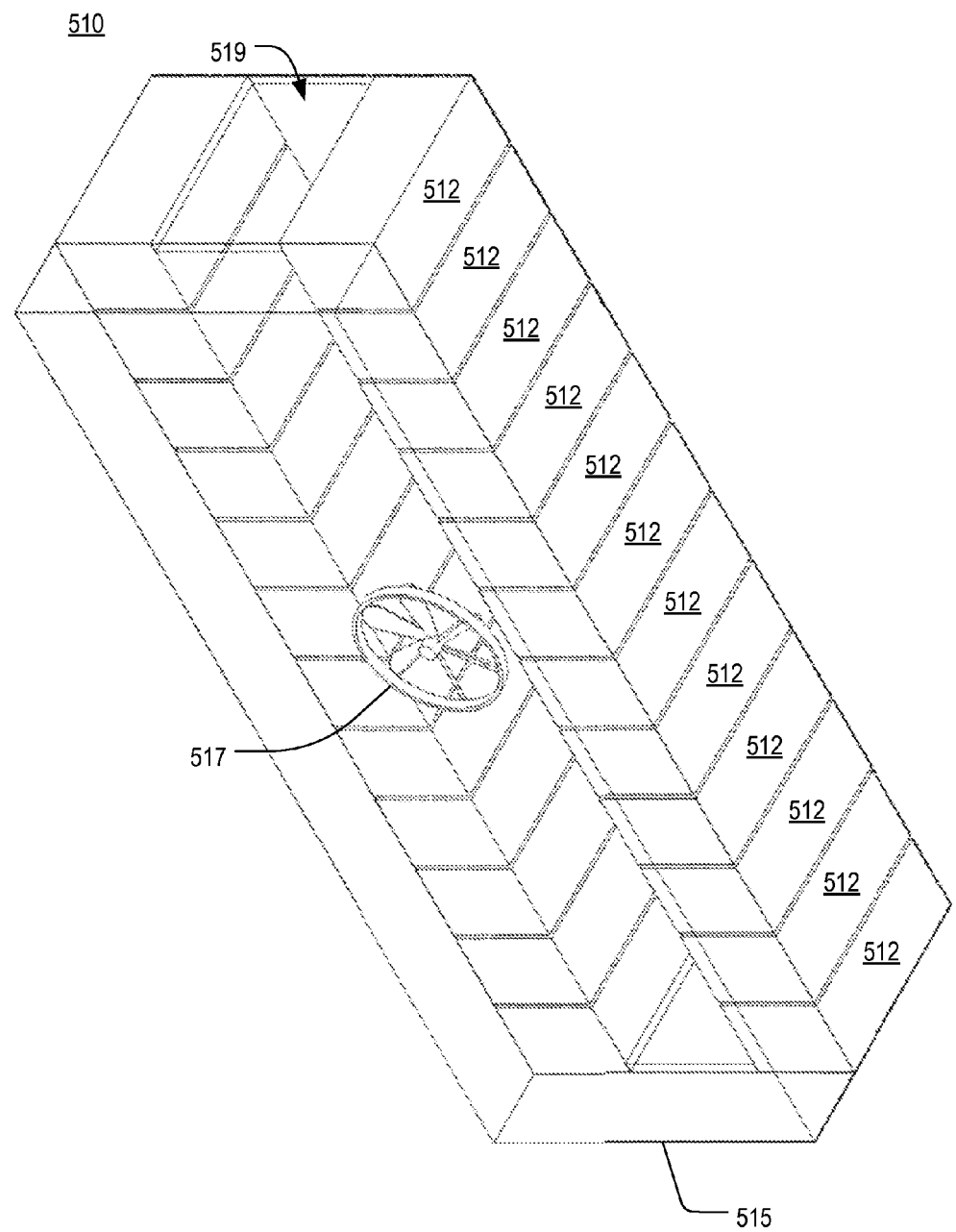
FIG. 12 is an isometric view of a sixth embodiment of a data processing equipment structure in accordance with one or more aspects of the present invention.

FIG. 12 is an isometric view of a sixth embodiment of a data processing equipment structure 510 in accordance with one or more aspects of the present invention. As shown therein, the data processing equipment structure 510 generally includes a pair of rows of equipment enclosures 512 that are arranged in side-to-side relationship. Together, the rows of enclosures 512 define an aisle 519 therebetween. The structure further includes a cooling unit/fan 517 beneath the aisle and a duct 515 located beneath the rows of enclosures 512 (shown as being transparent in FIG. 12). The duct 515 is adapted to contain and direct air during the cooling process and is in fluid communication with the enclosures 512 and the cooling unit/fan 517. Although one cooling unit/fan 517 is shown, it is contemplated that multiple such units may be implemented beneath the aisle 519. It is further contemplated that one or more doors may be utilized to seal ends of the aisle 519 from the outside environment and provide access to the aisle 519 when necessary.

In accordance with this embodiment, airflow can be directed such that cool air is drawn into enclosures 512 from the aisle 519 between the rows. In this regard, enclosures 512 of each row may be arranged such that cool air intakes face toward the aisle 519, and the aisle 519 between the rows operates as a "cold" aisle for containing a supply of cool air. Cool air is utilized to cool equipment mounted in the enclosures 512 and is then exhausted into the duct 515 beneath the rows of enclosures 512 as heated exhaust air. The cooling unit/fan 517 beneath the aisle 519 then draws heated exhaust air from the duct 215 into the cooling unit/fan 517, where the heated exhaust air is cooled before being reintroduced to the supply of cool air contained within the aisle 519.

Airflow can also be directed such that cool air is drawn into the enclosures 512 from the duct 515 beneath the rows of enclosures 512. In this arrangement, cool air is utilized to cool equipment mounted in the enclosures 512 and is then exhausted into the aisle 519 between the rows of enclosures 512 as heated exhaust air. In this regard, enclosures 512 of each row may be arranged such that heated air is exhausted toward the aisle 519, and the aisle 519 between the rows operates as a "hot" aisle for containing heated air exhausted from the enclosures 512. From the aisle 519 between the rows, heated exhaust air may be directed toward the cooling unit/fan 517 beneath the aisle 519 where the heated exhaust air is cooled before being reintroduced to the supply of cool air contained within the duct 515 beneath the rows of enclosures 512.

Figure 13:
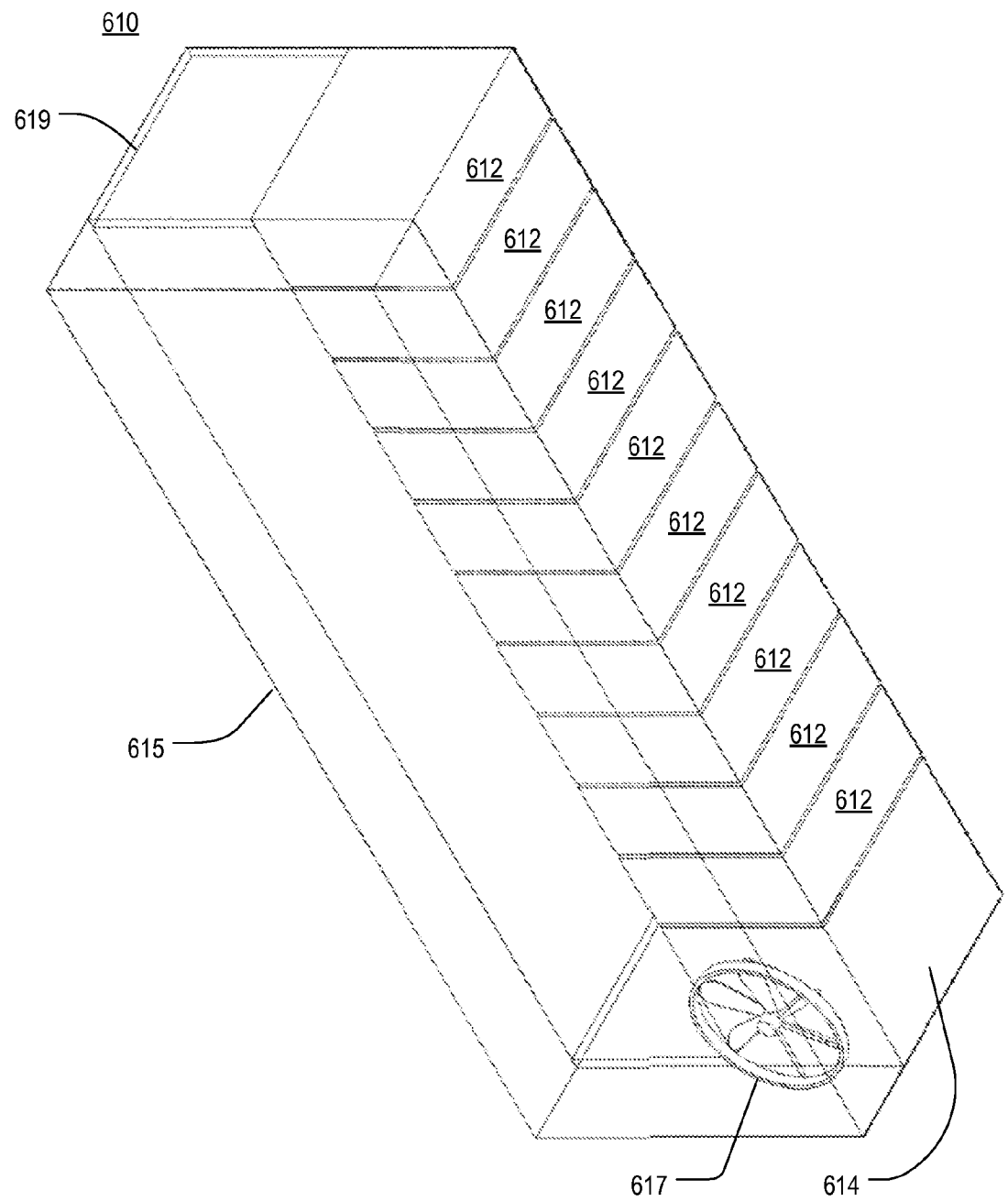
FIG. 13 is an isometric view of a seventh embodiment of a data processing equipment structure in accordance with one or more aspects of the present invention.

FIG. 13 is an isometric view of a seventh embodiment of a data processing equipment structure 610 in accordance with one or more aspects of the present invention. As shown therein, the data processing equipment structure 610 generally includes a plurality of equipment enclosures 612 organized in a row and at least one in-line cooling unit 614. Although just one cooling unit 614 is shown, it is contemplated that multiple cooling units 614 may be implemented within the row. The cooling unit 614 includes or operates in conjunction with a cooling fan 617 to assist in facilitating airflow during the cooling process. The structure 610 further includes a duct 615 arranged beneath the rows of enclosures 612 and the cooling unit 614 and a separate side duct 619 arranged at a side of the row. Each of the underneath duct 615 and the side duct 619 is in fluid communication with the enclosures 612 and the cooling unit 614.

In accordance with this embodiment, airflow can be directed such that cool air is drawn into the enclosures 612 from the side duct 619, which may be configured to function as a reservoir for cool air. Cool air is utilized to cool equipment mounted in the enclosures 612 and is then exhausted into the duct 615 beneath the rows of enclosures 612 and the cooling unit 614 as heated exhaust air. From the underneath duct 615, heated exhaust air may be directed toward the in-line cooling unit 614 where the heated exhaust air is cooled before being reintroduced to the supply of cool air contained within the side duct 619.

Airflow can also be directed such that cool air is drawn into the enclosures 612 from the underneath duct 615, which may be configured to function as a reservoir for cool air. Cool air is utilized to cool equipment mounted in the enclosures 612 and is then exhausted into the side duct 619 as heated exhaust air. From the side duct 619, heated exhaust air may be directed toward the in-line cooling unit 614 where the heated exhaust air is cooled before being reintroduced to the supply of cool air contained within the underneath duct 615.

Figure 14:
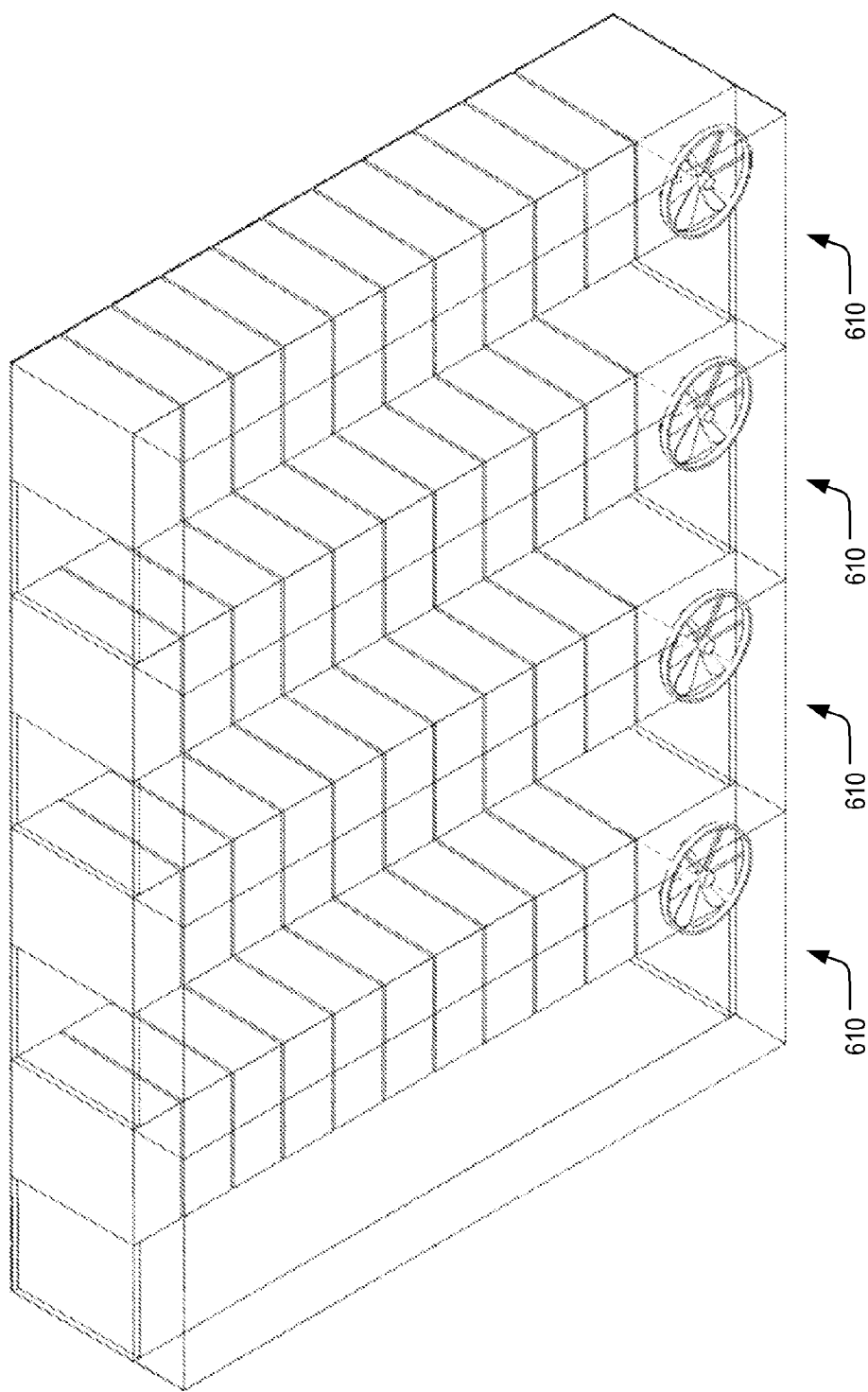
FIG. 14 is an isometric view of a plurality of the data processing equipment structures of FIG. 13, depicted in a side-to-side relationship.

FIG. 14 is an isometric view of a plurality of the data processing equipment structures 610 of FIG. 13, depicted in a side-to-side relationship. As shown therein, multiple data processing equipment structures 610 may be arranged adjacent one another to define an overall arrangement within a data center room. In this regard, structures 610 adjacent to one another within the data center room are capable of sharing common walls.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A data processing equipment structure comprising:
a plurality of sidewalls, a floor surface, and a ceiling panel, which, together, define an enclosed space;
at least one equipment enclosure disposed entirely within the enclosed space,
wherein each equipment enclosure comprises a top panel;
at least one cooling unit disposed entirely within the enclosed space and arranged in side-to-side relationship, in a row, with the at least one equipment enclosure,
wherein each cooling unit comprises a top panel; and
at least one separation panel arranged across, and in generally perpendicular relationship with, respective top panels of the at least one equipment enclosure and the at least one cooling unit, the at least one separation panel extending upwardly from the top panels into abutment with the ceiling panel;
wherein the at least one separation panel, in combination with the at least one equipment enclosure and the at least one cooling unit, thermally isolates a front plenum, extending from the floor surface to the ceiling panel along a front of the at least one equipment enclosure, from a rear plenum, extending from the floor surface to the ceiling panel along a rear of the at least one equipment enclosure; and
wherein each of the front plenum and the rear plenum is external to the at least one equipment enclosure and the at least one cooling unit, but fully contained within the enclosed space.

2. The data processing equipment structure of claim 1, wherein the volume of the front plenum is less than half of the volume of the enclosed space.

3. The data processing equipment structure of claim 2, wherein the front plenum is pressurized.

4. The data processing equipment structure of claim 1, wherein the at least one equipment enclosure is a plurality of equipment enclosures.

5. The data processing equipment structure of claim 4, wherein the at least one cooling unit is located at an end of the row.

6. The data processing equipment structure of claim 4, wherein one of the plurality of equipment enclosures is positioned at either side of the at least one cooling unit.

7. The data processing equipment structure of claim 4, wherein the at least one cooling unit is a plurality of cooling units.

8. The data processing equipment structure of claim 7, wherein the cooling units are located, within the row, proximate to equipment enclosures that house electronic equipment that requires cooling.

9. The data processing equipment structure of claim 1, further comprising a movable internal sidewall for scaling the size of the enclosed space.

10. The data processing equipment structure of claim 1, wherein the front plenum is a cooled air plenum and the rear plenum is a heated exhaust air plenum.

11. A data processing equipment structure comprising:
a plurality of sidewalls and a ceiling panel, which, together, define an enclosed space;
at least one equipment enclosure disposed entirely within the enclosed space, wherein each equipment enclosure comprises a top panel;
at least one cooling unit disposed entirely within the enclosed space and arranged in side-to-side relationship, in a row, with the at least one equipment enclosure,
wherein each cooling unit comprises a to panel; and
at least one separation panel arranged across respective top panels of the at least one equipment enclosure and the at least one cooling unit, the at least one separation panel extending upwardly from the top panels into abutment with the ceiling panel;
wherein the at least one separation panel, in combination with the at least one equipment enclosure and the at least one cooling unit, thermally isolates a front plenum from a rear plenum, each of the front plenum and the rear plenum being external to the at least one equipment enclosure and the at least one cooling unit, but fully contained within the enclosed space;
wherein the front plenum receives cooled air from the at least one cooling unit and facilitates passage of the cooled air into a front of the at least one equipment enclosure to cool electronic equipment housed therein; and
wherein the rear plenum receives heated exhaust air from a rear of the at least one equipment enclosure and facilitates passage of the heated exhaust air to an intake of the at least one cooling unit.

12. The data processing equipment structure of claim 11, wherein the volume of the front plenum is less than half of the volume of the enclosed space.

13. The data processing equipment structure of claim 12, wherein the front plenum is pressurized.

14. The data processing equipment structure of claim 11, wherein the at least one equipment enclosure is a plurality of equipment enclosures.

15. The data processing equipment structure of claim 14, wherein the at least one cooling unit is located at an end of the row.

16. The data processing equipment structure of claim 14, wherein one of the plurality of equipment enclosures is positioned at either side of the at least one cooling unit.

17. The data processing equipment structure of claim 14, wherein the at least one cooling unit is a plurality of cooling units.

18. The data processing equipment structure of claim 17, wherein the cooling units are located, within the row, proximate to equipment enclosures that house electronic equipment that requires cooling.

19. The data processing equipment structure of claim 11, further comprising a movable internal sidewall for scaling the size of the enclosed space.

20. A data processing equipment structure comprising:
a plurality of sidewalls, a floor surface, and a ceiling panel, which, together, define an enclosed space;
at least one equipment enclosure disposed entirely within the enclosed space,
wherein each equipment enclosure comprises a top panel;
at least one cooling unit disposed entirely within the enclosed space and arranged in side-to-side relationship, in a row, with the at least one equipment enclosure,
wherein each cooling unit comprises a to panel;
at least one separation panel arranged across respective top panels of the at least one equipment enclosure and the at least one cooling unit, the at least one separation panel extending upwardly from the top panels into abutment with the ceiling panel; and
a movable internal sidewall, external to the at least one equipment enclosure and the at least one separation panel, for scaling the size of the enclosed space;
wherein the at least one separation panel, in combination with the at least one equipment enclosure and the at least one cooling unit, thermally isolates a front plenum, extending from the floor surface to the ceiling panel along a front of the at least one equipment enclosure, from a rear plenum, extending from the floor surface to the ceiling panel along a rear of the at least one equipment enclosure, each of the front plenum and the rear plenum being external to the at least one equipment enclosure and the at least one cooling unit, but fully contained within the enclosed space;
wherein the front plenum receives cooled air from the at least one cooling unit and facilitates passage of the cooled air into a front of the at least one equipment enclosure to cool electronic equipment housed therein; and
wherein the rear plenum receives heated exhaust air from a rear of the at least one equipment enclosure and facilitates passage of the heated exhaust air to an intake of the at least one cooling unit.

* * * * *